(12) United States Patent
Grigg et al.

(10) Patent No.: US 6,506,681 B2
(45) Date of Patent: Jan. 14, 2003

(54) THIN FLIP—CHIP METHOD

(75) Inventors: Ford B. Grigg, Meridian, ID (US); Timothy L. Jackson, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 09/731,360

(22) Filed: Dec. 6, 2000

(65) Prior Publication Data

US 2002/0068453 A1 Jun. 6, 2002

(51) Int. Cl.[7] .............................................. H01L 21/00
(52) U.S. Cl. ........................ 438/692; 216/38; 216/88; 438/108; 438/113; 438/458; 438/459; 438/460; 438/690; 438/745
(58) Field of Search ................................ 438/108, 112, 438/113, 114, 458, 459, 460, 690, 691, 692, 745, 753; 216/38, 88

(56) References Cited

U.S. PATENT DOCUMENTS

| | | |
|---|---|---|
| 5,127,984 A | 7/1992 | Hua et al. |
| 5,250,843 A | 10/1993 | Eichelberger |
| 5,256,599 A | 10/1993 | Asetta et al. |
| 5,268,065 A | 12/1993 | Grupen-Shemansky |
| 5,273,940 A | 12/1993 | Sanders |
| 5,324,687 A | 6/1994 | Wojnarowski |
| 5,389,579 A | 2/1995 | Wells |
| 5,476,566 A | 12/1995 | Cavasin |
| 5,480,842 A | 1/1996 | Clifton et al. |
| 5,656,552 A | 8/1997 | Hudak et al. |
| 5,851,845 A | 12/1998 | Wood et al. |
| 5,888,838 A | 3/1999 | Mendelson et al. |
| 6,013,534 A | 1/2000 | Mountain |
| 6,017,822 A | 1/2000 | Mountain |
| 6,023,094 A | 2/2000 | Kao et al. |
| 6,030,485 A | 2/2000 | Yamada |
| 6,046,073 A | 4/2000 | Lang et al. |

*Primary Examiner*—William A. Powell
(74) *Attorney, Agent, or Firm*—TraskBritt

(57) ABSTRACT

Methods for thinning a bumped semiconductor wafer, as well as methods for producing flip-chips of very thin profiles, are disclosed. According to the methods of the present invention, a mold compound is interspersed between conductive bumps on the active face of a wafer to provide support and protection for the wafer structure both during and after a process of removing the wafer's inactive backside silicon surface. The mold compound also serves to preserve the integrity of the conductively bumped aspects of the wafer during subsequent processing and may, after the wafer is diced, act as all or part of an underfill material for flip-chip applications.

84 Claims, 4 Drawing Sheets

THIN FLIP—CHIP METHOD

BACKGROUND OF THE INVENTION

1. Field of the Invention

The present invention relates to a method of thinning semiconductor wafers. More specifically, the present invention relates to a method of supporting bumped semiconductor wafers during a wafer thinning process using a mold compound which also acts as an underfill material in flip-chip mounting.

2. State of the Art

In order to increase production rates and to reduce costs for the manufacturing of integrated circuit semiconductor dice, a multitude of semiconductor dice are typically fabricated at one time onto a wafer comprising a semiconducting substrate (e.g., silicon or gallium arsenide) through methods well known in the art. Referring to drawing FIGS. 1 and 1A, the wafer 10 includes an active surface 15 where the semiconductor dice 20 reside and a backside 17. After fabrication, individual semiconductor die 20, commonly referred to as dice in the plurality or a die 20 in the singular, are typically separated from the wafer by sawing the wafer along boundary or scribe lines (streets) formed between each semiconductor die 20. Once separated, the semiconductor dice 20 can be packaged in various configurations, including smart-card packages and packages containing more than one semiconductor die 20, also known as multi-chip modules (MCMs).

The demand for smaller, higher performance semiconductor dice which support portable communications devices, including memory cards, smart cards, cellular telephones, and portable computing and gaming devices, has motivated the development of new techniques for producing smaller and thinner semiconductor dice from thinned wafers.

In addition to thinner profile advantages, there are other important benefits to reducing the thickness of a silicon semiconductor die in terms of enhancements to device performance and reliability. One of the major problems in increasing the speed and power of a chip is the removal of heat, particularly since semiconductor materials are generally poor thermal conductors. Nearly all semiconductor material is theoretically susceptible to thinning, as the performance characteristics of the semiconductor die are basically contained in 2–3 µm of active circuitry. Thinning a semiconductor die reduces the serial thermal resistance between the active circuitry on the front side or active surface of the semiconductor die and the backside of the semiconductor die, making for faster thermal transfer. Thinner semiconductor die may also aid problems caused by mismatches between coefficients of thermal expansion (CTE) of materials within a packaged semiconductor die. In this regard, thinner semiconductor dice are less prone to bond and silicon fracture because a reduced semiconductor die thickness allows the semiconductor die to flex with the substrate or board to which it is mounted. Thus, the semiconductor die thinning process can dramatically decrease the chances of thermal cycling-induced bond stress as well as reduce the chances of semiconductor die cracking.

A competing trend in current wafer manufacturing is to increase wafer size in order to reduce the costs of manufacturing an individual semiconductor die. At the present, wafers are typically around eight inches (8") in diameter. Since silicon and gallium arsenide are relatively brittle materials, a minimum thickness of the wafer is required in order to handle a wafer of this size without breaking it. Since wafers having a diameter of approximately twelve inches (12") are being used in the manufacture of semiconductor dice, thicker silicon wafers are required to withstand wafer handling and manufacturing processes.

With the lowest possible package profile thickness and size as the goal for the semiconductor die, however, the substrate thicknesses required for larger diameter wafers to be able to withstand wafer handling and manufacturing processes may not be suitable for some electronics applications. One way of reducing the thickness of such packages is to use semiconductor dice that are as thin as possible manufactured from wafers which are as thin as possible.

Typically, thin semiconductor dice are produced from thinned wafers, the wafer being thinned while in wafer form using a mechanical surface grinding (backgrinding) process, although chemical or plasma etching methods are sometimes used. Grinding is advantageous in that it can reduce wafer thickness accurately and at a relatively significant rate, making it a very affordable and simple process. Grinding also suffers from several disadvantages, however. Protective measures must be taken to ensure the circuit pattern-formed active surface 15 of the wafer is not stained or injured with grinding trashes, etc. Further, backgrinding can induce significant stress and damage the silicon wafer unless some form of support for the wafer is provided.

Referring to drawing FIG. 2A, illustrated is a backgrinding apparatus for thinning a semiconductor wafer 10. The basic elements of a backgrinding apparatus comprise a holding chuck 51, which may apply a vacuum force to hold the wafer, and a grinding wheel 52. In a representative wafer backgrinding process, a semiconductor wafer is placed between the holding chuck 51 and the grinding wheel 52 wherein the exposed surface on the backside 17 of a semiconductor wafer 10 is thinned to a desired thickness by the mechanical action of a grinding wheel. This process may also be extended to involve chemical mechanical polishing (CMP).

Illustrated in drawing FIG. 2B is a side view of semiconductor wafer 10 shown schematically wherein a thickness 17a of the inactive backside surface 17 of a semiconductor wafer 10 has been ground away.

In processing the semiconductor wafer, a protective member or submount can be previously adhered to the active surface 15 of the semiconductor wafer to protect the circuitry of the semiconductor dice formed on the semiconductor wafer. Protective members known in the art include adhesive tapes (such as UV tape) and a variety of resists, while submounts are typically formed of wax, glass, quartz, sapphire, metal, alumina, gallium arsenide or silicon and are secured to the wafer by an adhesive or bonding material. After backgrinding, a cleaning fluid is generally used to remove wafer debris and cool the semiconductor wafer. The cleaning fluid is subsequently dried, typically through a light source such as a halogen lamp. The protective tape, resist or submount is then removed from the active surface of the semiconductor die formed on the semiconductor wafer.

Although these prior art protective members provide a certain degree of support and possibly some cushioning during the backgrinding of the semiconductor wafer, their use is less than optimal for some applications. Areas of improvement include convenience and cost of use, increased structural support during grinding, ease of removal after the grinding process, and compatibility with other chip and/or fabrication steps. Tapes in particular pose challenges because of their high adhesive strength and the compressive stress they tend to induce on thinned semiconductor wafers.

A variety of methods exist for thinning a semiconductor wafer and for thinning an individual semiconductor die. U.S. Pat. No. 6,030,485 to Yamada relates to a method and apparatus for a wafer grinding process that uses an ultraviolet- (UV) sensitive tape to support the semiconductor wafer and protect circuitry elements during the grinding process. The UV-sensitive tape is manufactured with an adhesive agent that is reactive with ultraviolet rays and heat used in the drying process so as that the adhesive agent becomes less adhesive, thus allowing the tape to be peeled off U.S. Pat. No. 5,324,687 to Wojnarowski discloses a method of thinning semiconductor dice wherein the semiconductor dice are first adhesively mounted in die carriers made of removable or dissolvable material such as glass, metal, ceramics, etc. The front sides of the semiconductor dice are then adhered to a dielectric layer which, in turn, is overlaid with a resin layer followed by a holding layer made of a strong stiff material, such as magnetic metal. The semiconductor dice are then thinned by removing portions of the back surface of the semiconductor die and the carrier layer simultaneously. After a base or heat sink is bonded to the back of the semiconductor die, the holding member is detached by various methods, including chemically or electrochemically etching the holding member away, or by induction heating.

U.S. Pat. No. 5,389,579 to Wells discloses a method for single-sided polishing of a semiconductor wafer using double-sided polishing equipment in order to achieve flatter polished wafers. In Wells, a protective oxide coating is grown on one side of the wafer while the semiconductor material on the other side is left exposed. The wafer is then subjected to a two-sided grinding step wherein a polishing slurry removes semiconductor material from the exposed side while the oxide layer prevents the polishing of the second side of the semiconductor wafer.

U.S. Pat. No. 5,250,843 to Eichelberger outlines a semiconductor die thinning process where the semiconductor dice are placed face down and attached to a glass plate by an adhesive. The semiconductor dice and plate are then coated with a sealing layer to protect against material being lodged under the semiconductor die and to buffer the edges of the semiconductor dice. The semiconductor dice each further have a side protection material applied to prevent any possible lapping material from contacting the active surface of the semiconductor die during the lapping (backgrinding) process.

U.S. Pat. No. 5,127,984 to Asetta et al. discloses a thinning process wherein a high melting temperature wax is used as a bonding agent to bond a wafer to a quartz, glass, sapphire or metal submount. The wax, in non-water soluable semi-liquid format, is applied to a surface of a spinning semiconductor wafer, the semiconductor wafer spinning so as to ensure a uniform layer of the wax. The submount is placed on the wax layer and then the assembly is heated in a vacuum environment to remove air voids in the layer. Any excess wax is removed with solvent. To detach the wax and submount after grinding, the submount is heated until the wax softens and is liquified, thereby weakening the wax bond. The semiconductor wafer is then pushed from the submount onto a nonstick platform surface.

U.S. Pat. No. 5,273,940 to Sanders discloses a method for reducing the thickness of a plurality of semiconductor dice during the formation of a semiconductor die package. The method of Sanders entails electrically and physically coupling a plurality of unthinned semiconductor dice to the surface of a semiconductor substrate through conductive bumps, leaving the backside of the semiconductor dice exposed. The semiconductor dice and substrate are then encapsulated, the encapsulation material serving to protect the semiconductor dice, including the active side circuitry of individual semiconductor die, as well as protecting the semiconductor die interconnections to the mounting substrate and further fastening the semiconductor dice. Thereafter, a grinding disk removes material from the backside of each semiconductor die to produce a low profile multi-chip package.

Grinding before semiconductor dice singulation has its limits, however, since the scraping away of silicon material can distort the silicon crystal lattice of the semiconductor wafer, resulting in stress fields that can ultimately degrade semiconductor die performance. Wet-etching is typically used to reduce some of the post-grinding residual damage. In this process, about 50 $\mu$m of material can be further removed from the semiconductor wafer to eliminate the stress concentration and crack initiation points in the crystal lattice, provided the wafer remains relatively thick so as to withstand the demands of handling. Exemplary wet-etching processes used in combination with the mechanical removal of silicon through backgrinding are disclosed in U.S. Pat. No. 5,480,842 to Clifton et. al., and in U.S. Pat. No. 5,268,065 to Grupen-Shemansky.

More recently, an etching process using atmospheric downstream plasma (ADP) dry chemical etching (DCE) technology has been developed. ADP-DCE has thinning capabilities of 2 mils and below while additionally offering the stress-reducing benefits of wet chemical etching. While demonstrating significant advantages, throughput under ADP-DCE is lower than that of grinding as ADP-DCE does not provide similar silicon removal rates. Furthermore, the ADP-DCE process uses environmentally-unfriendly fluorine-based chemicals.

Another recent innovation in the art of thinning wafers uses a "dicing before grinding" (DBG) method to grind semiconductor wafers to very thin levels (approaching 30 $\mu$m). The DBG method advantageously avoids etching and the handling of fragile thinned semiconductor wafers after grinding. In this process, a wafer is scored (diced) to a depth of approximately 50 $\mu$m to separate the semiconductor die. The diced active surface is then protectively taped in order to shield it during grinding, then a second layer of tape is applied to hold the diced semiconductor dice. The semiconductor wafer is then subjected to a back grinding process until the scores are reached, at which point the semiconductor dice automatically separate. The semiconductor dice that result are reportedly stronger than semiconductor dice that have been subjected to chemical etching.

The applicability of these exemplary methods, however, is challenging in the context of commonly used flip-chip semiconductor die manufacturing processes, which may involve bumped semiconductor wafers. Flip-chips, because of their capacity for low-profile and high-density interconnections, are being used in ever-increasing numbers.

Flip-chips are generally characterized as semiconductor dice with solder or other conductive bumps placed on I/O pads of the active surface of the semiconductor die and wherein mounting the semiconductor die involves flipping the semiconductor die over, aligning the semiconductor die with contact pads on a substrate, and applying heat to reflow (melt) the solder balls to establish bonding between the semiconductor die and the substrate.

Controlled-Collapse Chip Connection (C4) technology is one exemplary flip-chip technology which utilizes solder bumps deposited on solder wettable metal bond pads on the active surface of the semiconductor die in combination with a matching footprint of solder wettable contact pads or terminals on the substrate. The technology involves first, laying down a passivation layer on the surface of a semiconductor die which covers the bond pads where connections will be made between the semiconductor die and a substrate. Next, holes are formed in the passivation layer over the bond pads of the semiconductor die and metallization is deposited. Finally, solder bumps are deposited on the metallized areas of the semiconductor die and a preliminary reflow performed so that the bumps take on a semi-spherical shape. Later, after alignment with a substrate, a final reflow will form the semiconductor die-to-substrate connections.

An advantage in using flip-chip technology is that semiconductor die size can be kept to a minimum since the semiconductor die does not employ a traditional package body. Furthermore, electrical connections between a semiconductor die and a substrate are confined to an area of the substrate which does not exceed the size of the semiconductor die. There is no need for wire bonds or for any kind of external lead in order to couple the semiconductor die to the substrate. Flip-chip technology is further considered advantageous in certain applications because the I/O pads are distributed over the entire semiconductor die surface rather than being confined to the periphery of the semiconductor die as in wire bonding and most tape-automated bonding (TAB) techniques. Finally, conventional solder-bumped flip-chip arrangements allow a high density of connections per given area of active surface of the semiconductor die, and the least amount of semiconductor die-to-carrier connection time because of the ability to effect all connections simultaneously.

When mounting a flip-chip semiconductor die to a substrate, the substrate is prepared with solder flux prior to "flipping" the semiconductor die over and aligning the solder bumps with the substrate terminals. All of the solder joints are then formed simultaneously by reflowing (melting) the solder to achieve electrical connection. Residual flux is then removed using an appropriate solvent.

To enhance the bond integrity formed by the bumps located between the flip-chip semiconductor die and the substrate, an underfill material typically comprised of a suitable polymer is introduced in the gap between the semiconductor die and the substrate. One area of concern in flip-chip packaging is thermal expansions resulting from CTE mismatches between the underfill, the semiconductor die and the substrate. If these materials are not suitably thermally matched, there may be undue strains at the bumped electrical connections which could lead to failure of the packaged semiconductor device.

The increased use of flip-chip semiconductor dice pose additional obstacles for certain wafer manufacturing processes in that it is presently extremely difficult to grind a wafer after it has been bumped. After bumping, the fragile nature of the bumped active surface of the wafer preclude conventional methods of taping, adhesive mounting, etc. Wafers can be thinned before bumping, but handling requirements for the bumping process serve to limit wafer thinness under traditional grinding methods to an estimated range of 250 through 500 µm thickness.

Additionally, flip-chip semiconductor dice may be chipped during dicing operations. The separated flip-chip semiconductor die may have, for example, rough edges as a result of the dicing process. A basic consideration when dicing or sawing a wafer is how much chipping of the semiconductor die can be tolerated. Chipping is observed on both the topside and backside of the semiconductor wafer. For a given saw process, chipping can vary drastically between these two sides. Topside chipping is readily visible on the active surface of a semiconductor wafer. It consists of scalloped-shaped chip outs along the edge of the saw kerf. Uncontrolled topside chipping of the semiconductor wafer directly correlates to assembly line yield losses. If the topside chipping of the semiconductor wafer is excessive, damage can result in damage to the active circuitry of the semiconductor dice on the semiconductor wafer, causing device failure or performance degradation. With the advent of thin surface mount components (TQFP, TSSOP), there is an apparent trend to significantly reduce semiconductor wafer thickness. However, chipping of the semiconductor wafer is more prevalent in thinner wafers as a result of silicon stress.

After a flip-chip semiconductor die is separated from the other flip-chip semiconductor dice of the semiconductor wafer, the flip-chip semiconductor die is then packaged and/or mounted to a substrate, such as a printed circuit board. As a result of chipping, the flip-chip semiconductor die may suffer various forms of damage at any point subsequent to the dicing process. For example, the flip-chip semiconductor die may be damaged while it is being handled prior to mounting or packaging.

Several recent semiconductor wafer thinning methods have been developed to overcome the problems associated with thinning bumped semiconductor wafers. Certain of these methods use varying etching processes in combination with a non-contact holding method for supporting the bumped area of the semiconductor wafer during the etching process. In each case, the semiconductor wafer is positioned face down on a stream of inert gas which levitates the semiconductor wafer, the gas stream acting to protect both the front and side edges of the semiconductor wafer during etching. While satisfactorily protecting the bumped surface of the semiconductor wafer during thinning, these methods utilize comparatively complex apparatus and are, therefore, relatively expensive to operate. In addition, the rate of removal of silicon material using these methods is inferior to that of a conventional grinding process.

Accordingly, what is needed within the art is a method of thinning a bumped semiconductor wafer that allows for rapid, inexpensive and accurate removal of semiconductor wafer material while protecting the bumped surface and the sides of the semiconductor wafer. Further needed is a method which minimizes the risk of semiconductor wafer breakage during handling. Ideally, such a method would be compatible with conventional semiconductor wafer thinning procedures and equipment, result in as few process steps as feasible, be suitable for use in high throughput production, and result in very thin semiconductor die suitable for stacking or use in very low-profile semiconductor die packages.

BRIEF SUMMARY OF THE INVENTION

The present invention relates to methods for thinning an inactive silicon surface of a semiconductor wafer wherein the semiconductor wafer has been provided with conductive bumps over an active surface area thereof. According to the methods of the present invention, a mold compound is placed on the active surface area of the semiconductor wafer to provide support and protection for the semiconductor wafer structure, both during and after a process of removing the surface of inactive backside of the semiconductor wafer. The mold compound also serves to preserve the integrity of the conductively bumped aspects of the semiconductor wafer during subsequent processing, and may, after the semiconductor wafer is diced, act as all or part of an underfill material for flip-chip semiconductor die applications. In one embodiment, the semiconductor wafer is placed in a mold apparatus where the molding compound is evenly interspersed between the bumped conductive aspects on the active surface area of the semiconductor wafer. The mold is preferably configured with a release liner which is placed in contact with a top portion of the conductive bumps to limit their exposure to the mold compound. Alternatively, the mold compound may be applied between the conductive bumps and over the active surface area of the semiconductor wafer by other means known in the art, such as by needle dispense. The mold compound may also be placed on one or more side edges of the semiconductor wafer to provide added protection against topside chipping during a subsequent dicing process.

In a most preferred embodiment, the mold compound protective/support layer is used in combination with a "dice before grind" process. In this process, the semiconductor wafer is scored through the mold compound and active surface area of the semiconductor wafer to a predetermined depth into the underlying inactive silicon layer, the depth of the scoring representing the desired thickness of an integrated circuit semiconductor die. The surface of the inactive backside of the wafer is then removed until the scores are reached, resulting in integrated circuit semiconductor dice of very low profiles. Preferably, semiconductor wafer thinning is accomplished by a back grinding process, which may be combined with chemical polishing to lessen post-grinding residual damage. Prior to thinning the semiconductor wafer, a face tape may be applied over the active face area of the semiconductor wafer to further absorb forces applied to the bumped wafer surface during the process of silicon removal. The face tape may also be configured with a layer of reflux material thereon which, upon removal of the face tape, will leave a residue of reflux on the top portions of the conductive bumps useful for subsequent reflow operations.

After thinning and singulation of the semiconductor dice, the resulting integrated circuit semiconductor dice may be mounted by conventional die attachment techniques to an appropriate substrate. Electrical connection between the integrated circuit chips and the substrate may be effected by various means, including solder reflow and conductive adhesive. With regard to mounting, the previously applied mold compound can act as all or part of an underfill material to fill the gap between a singulated integrated circuit semiconductor die (e.g., a flip-chip) and its mounting substrate. As such, the mold compound serves to protect the conductive bump and mounting substrate bond pad interconnections, for example, by reducing solder joint failure between the bumps and contact pads by spreading any applied stresses over the entire surface of the bump mount. The mold compound can also advantageously be used during reflow, providing a uniform bondline to allow the semiconductor die to remain parallel to the interconnection substrate during mounting, and to provide passivation to prevent the conductive bumps from shorting. As an underfill material, the mold compound further serves to absorb the inherent physical and thermal stress resulting from differing expansion rates of the connected semiconductor die and mounting substrate under thermal loading. The mold compound also allows for relatively high throughput in underfill applications, while avoiding the occurrence of voids. In another aspect, further underfill material may be added to the mounted semiconductor die, and the semiconductor die and its related interconnections may be encapsulated.

In addition to a method for thinning a semiconductor wafer, a flip-chip semiconductor die formed by the methods of the present invention is provided. Also provided are methods of fabricating flip-chip semiconductor dice and related flip-chip semiconductor die assemblies. Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

The method and apparatus of the present invention will be more fully understood from the detailed description of the invention taken in conjunction with the drawings, wherein.

DETAILED DESCRIPTION OF THE INVENTION

Preferred embodiments of the present invention will be described in detail hereinbelow with reference to the attached drawings.

Figure 1:
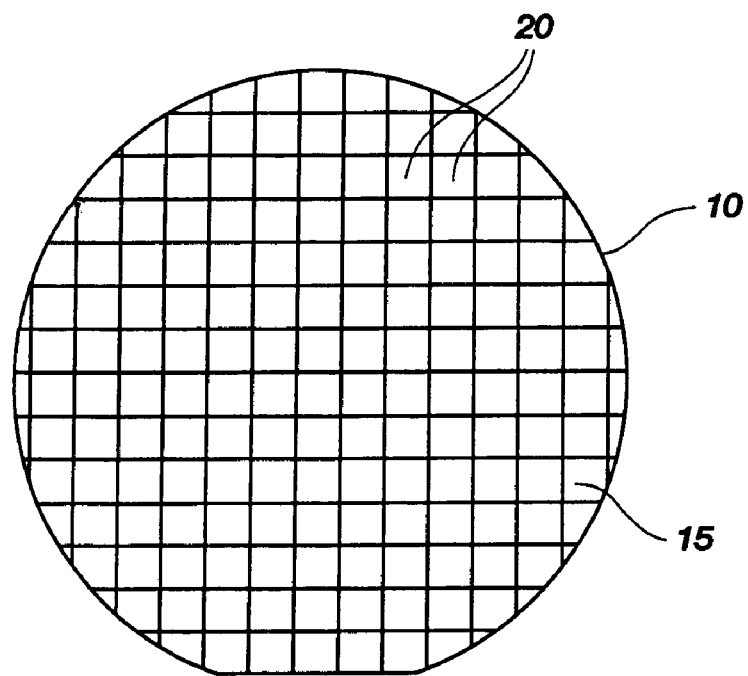
FIG. 1 illustrates a top view of a typical semiconductor wafer that has been subjected to a dicing process.
Figure 1A:
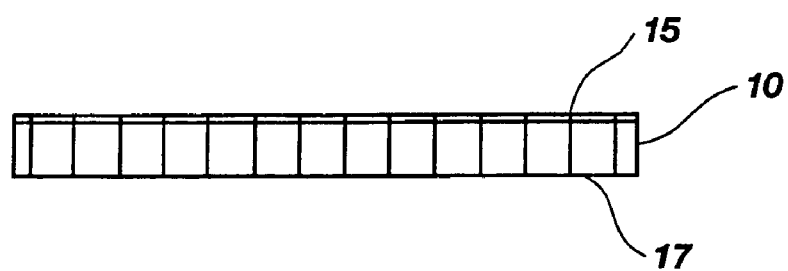
FIG. 1A is a cross-sectional view of the typical semiconductor wafer of drawing FIG. 1 that has been subjected to a dicing process.
Figure 2A:
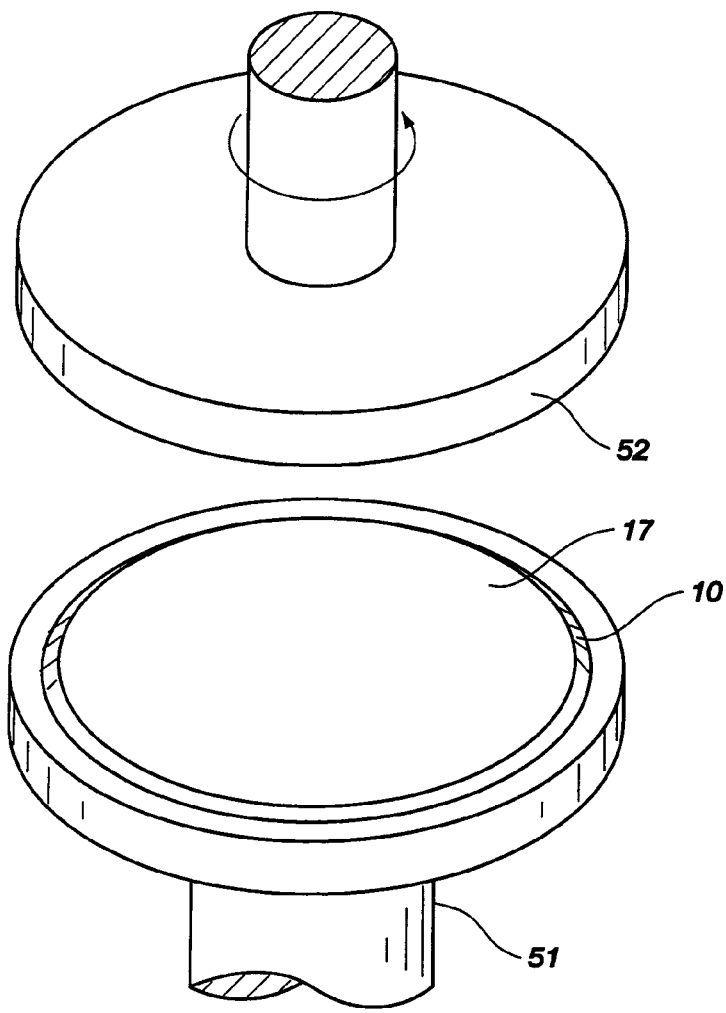
FIG. 2A illustrates a conventional backgrinding apparatus and semiconductor wafer mounted thereon.
Figure 2B:
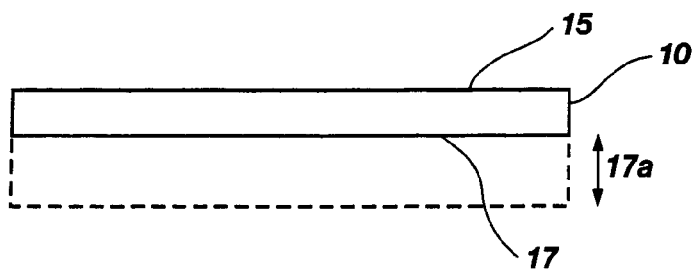
FIG. 2B shows a semiconductor wafer which has been subjected to a thinning process (i.e., had its cross-section reduced)
Figure 3:
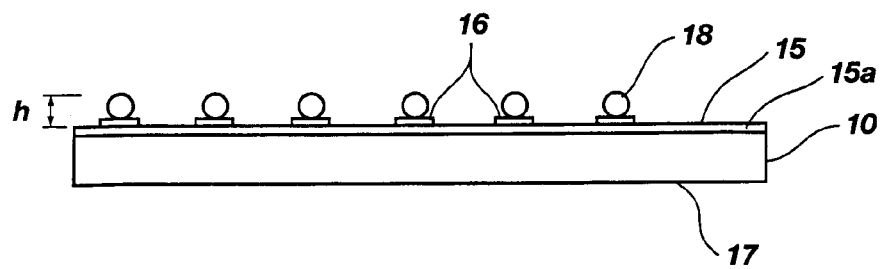
FIG. 3 is a cross-section of an exemplary semiconductor wafer that has been provided with conductive bumps over its active surface area.

Illustrated in drawing FIG. 3 is a cross-section of an exemplary semiconductor wafer structure 10 for use in the method of the present invention. While drawing FIG. 3 provides an illustration of a semiconductor wafer structure, it is understood that the present method can be applied to semiconductor wafers of any size or thickness, or any composition of material, including the various six (6) inches in diameter, eight (8) inches in diameter, and twelve (12) inches in diameter semiconductor wafers currently known in the art. Semiconductor wafer structure 10, generally comprised of silicon although gallium arsenide can be used, includes an active surface 15 (active surface area) and a backside 17 (inactive surface). Active surface 15 is configured with integrated circuitry 15a having bond pads 16 formed thereon comprising each semiconductor die, the bond pads 16 for the placement of conductive bumps for making flip-chip-type interconnections of the semiconductor die with a substrate. As shown, semiconductor wafer structure 10 has been subjected to a bumping process wherein conductive metal bumps 18, typically solder balls, have been placed on bond pads 16 of each semiconductor die formed on the semiconductor wafer 10.

As referred to herein, "bumping" comprises a process of adding raised electrically conductive contacts or bumps, typically a solder metal alloy, to bond pads formed on the active surface of a semiconductor die formed on the active surface area of a semiconductor wafer. Although electrically conductive bumps 18 (electrically conductive bumps 18 will be described hereafter as "conductive bumps") are preferably formed of various solder alloys, it is understood that any other materials known in the art (e.g., gold, indium, tin, lead, silver or alloys thereof) that can serve to make electrical interconnects to the circuits and/or bond pads 16 of wafer 10 can also be used. Additionally, the conductive bumps 18 may be formed of conductive polymeric and epoxy materials and may include various metals being contained therein, may be plated with metals after formation, etc.

Conductive bumps 18 may be applied to a semiconductor wafer by any means known in the art, including, but not limited to, screen printing, plating, sputtering, evaporation, and selective deposition/layering and layer removal techniques, and the like. Once deposited, conductive bumps 18, when made of solder alloys, may be subject to preliminary reflow processes to achieve a desired semi-spherical shape. Alternatively, conductive bumps 18, when made, for example, by selective deposition/layering and layer removal techniques, may be formed of columnar or pillar configuration and have an aspect ratio of height to width of greater than one. Such columnar or pillar configured bumps are relatively slender when compared to semi-spherical bumps of the same height and are desirable for two reasons. First, the more slender nature of these conductive bumps allows for more conductive bumps to be disposed on a semiconductor die without inadvertent lateral connection between the bumps during reflow. Second, the more slender conductive bumps are better able to tolerate thermal expansions of a semiconductor die and its interconnecting substrate than semi-spherical shaped conductive bumps of the same height. In the case of both semi-spherical conductive bumps and conductive bumps of columnar or pillar configuration, conductive bumps 18 are spaced apart at a predetermined "pitch," or center distance between bumps, so as to prevent the conductive bumps from flowing together during reflow of solder alloys or other reflowable materials. Selection of the proper bump pitch is governed by factors such as bump size, bump shape, and contact pad metallization characteristics. As can be seen in drawing FIG. 3, conductive bumps 18 are also configured with a height (h) which provides a measurable standoff distance or gap between the top of the conductive bump and the active surface 15 and contact pads 16 of the semiconductor dice of the semiconductor wafer.

As previously discussed, the prior art methods of thinning semiconductor wafers are not optimized for the high throughput grinding and handling of semiconductor wafers of very thin profiles. The present invention provides a novel method for taking the thinning of semiconductor wafers to the next level through the introduction of a stabilizing, structurally supportive molding (or mold) compound between the bumped aspects of a wafer. The mold compound also protects the wafer surface and acts as part or all of the underfill for flip-chip applications. By use of the term "mold compound," it is understood to mean any compound that can be applied or fashioned, by use of a compression mold or otherwise, to provide or enhance structural support for a semiconductor wafer during various wafer processing steps, including the steps of dicing, thinning and handling. By "structurally supportive," it is meant that the mold compound either provides or enhances structural support for the semiconductor wafer in its form as applied, or that it transitions to become structurally supportive at a later time, for example, by means of a curing step. When using the mold compound according to the thinning methods of the present invention, bumped semiconductor dice (also referred to as "integrated circuit chips") thicknesses of 6 mil can be attained. For unbumped semiconductor dice, thicknesses of 2 mil can be achieved.

Figure 5:
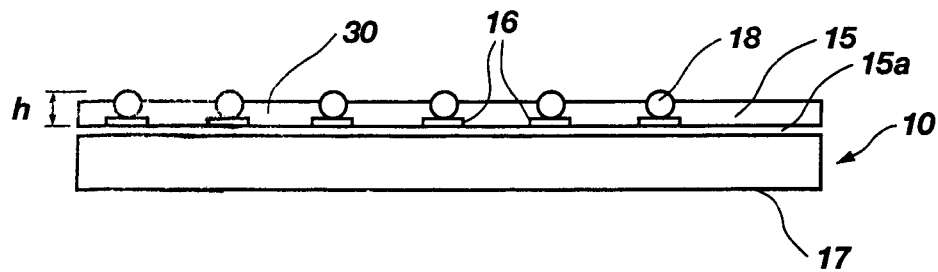
FIG. 5 illustrates a cross-section of a bumped semiconductor wafer that has been prepared for semiconductor wafer thinning by an embodiment of the present invention using a mold compound.

Illustrated in drawing FIG. 5 is a cross-section of a bumped semiconductor wafer structure 10 that has been prepared for wafer thinning by an embodiment of the present invention. According to a method of the present invention, a quantity of mold compound 30 is shown generically interspersed between conductive bumps 18 and over the active surface area 15 and integrated circuitry 15a of semiconductor wafer structure 10. Conductive bumps 18, which are typically formed of generally similar dimensions (height, radius (in the case of semi-spherical bumps), and configuration), are typically of a size 0.6 mm or less, and have a spacing or pitch of approximately 0.80 mm or less. It is understood within the method of the present invention, however, that the size and pitch of conductive bumps 18 can be highly variable, limited only by reflow constraints, contact pad metallization, and/or the viscosity of the molding compound 30 to be interspersed therebetween. In most applications, the standoff gap for the underflow of mold compound will be approximately 50 $\mu$m or greater. For example, a standoff gap of from approximately 50 to 100 $\mu$m is contemplated for a 125 $\mu$m solder ball. A standoff gap of about 50 $\mu$m is preferable for most underflow applications using the present method. For mold compounds of very low viscosity that cure with physical characteristics suitable for providing structural support consistent with the purposes of the present invention, standoff gaps of less than 50 $\mu$m may be used.

Referring again to drawing FIG. 5, mold compound 30 is typically applied in liquid form such that it surrounds, but does not fully cover, the top area portions of each of solder bumps 18. Mold compound 30, when cured or otherwise provided in rigid form or condition, thus provides semiconductor wafer 10 with added strength and energy absorption during subsequent processing steps such as thinning, handling, and wafer sawing. Mold compound 30 also serves to protect the active circuitry and conductive bumps 18 on the active surface 15 of each semiconductor die formed on the active surface area of the semiconductor wafer 10.

The present invention includes a relatively simple method for fabricating and thinning a bumped semiconductor die. As described herein, reference will be made to processing steps performed on a semiconductor wafer, although it is understood that the present inventive method is also generally applicable to the fabrication and thinning of any type of individual bumped semiconductor device, including flip-chips in particular.

The first step in the present method is to bump the semiconductor wafer, which may be accomplished by conventional processes as described above. The process begins with a semiconductor wafer provided with either a standard pad layout or with rerouted pads. Preferably, an eight (8) inch diameter semiconductor wafer is used, although wafers of larger or smaller diameters (e.g., 12" dia., 6" dia., or 4" dia. wafers) are also contemplated for use in the present method. For bumping, the minimum semiconductor wafer thickness is typically 0.020 inches (0.5 mm) for 4, 5, or 6 inch (100, 125, or 150 mm) wafers. For 8 inch (200 mm) wafers, the minimum semiconductor wafer thickness is typically 0.025 inches (0.6 mm). By "standard pad layout"

it is meant that the active surface area of the semiconductor wafer has been optimized with a pad placement resulting in a high density of circuitry. More preferable for flip-chip semiconductor wafer manufacturing processes is to provide the wafer with rerouted or redistributed pads. In either case, the pattern of the pads preferably should be capable of reliable reproduction from semiconductor wafer to semiconductor wafer. In the situation of "rerouted pads," the bond pads of the semiconductor die are literally relocated or redistributed by adding one or more metal traces that connect the "new" pad for ball placement to the original pads. Thus, the use of rerouted or redistributed pads are particularly advantageous for flip-chip semiconductor die packages in that fine pitches can be translated into coarser pitches, allowing for development of wider pad structures and taller bumps, which in turn provide improved underfill flow, tolerance of board flatness variations, and better thermal cycle fatigue life. Rerouted contact pads further advantageously allow for the development of common footprints. Such a rerouting process may be accomplished, for example, by use of the following steps: 1) placing a first dielectric layer on the semiconductor wafer; 2) sputtering a thin-film metal layer (typically Al, NiV, or Cu) that is then etched to form the trace and pad for the semiconductor die; 3) placing a second dielectric layer over the wafer for passivation of the redistribution wiring and definition of the solderable area for the ball located on the bond pad of a semiconductor die; 4) attaching a preformed solder ball to the bond pad of a semiconductor die; and 5) reflowing the solder.

In one embodiment, which may be dictated by subsequent processing steps involving the use of a compression mold configured with matching recesses for conductive bumps 18 for the application of molding compound 30, conductive bumps 18 are formed on the bond pads 16 of the semiconductor die so as to have substantially similar dimensions with regard to height and dimensional configuration. Alternatively, conductive bumps 18 placed on pads 16 of the semiconductor die may be produced by conventional processes in which the bumps 18 may vary dimensionally. For purposes of the present invention, an important criterion in the dimensional formation of conductive bumps 18 is that a measurable standoff distance or gap is provided between the top of the bump and the active surface 15 and bond pads 16 of the semiconductor die of the semiconductor wafer. It is, therefore, understood that conventionally formed solder bumps or other bumps formed by conventional means are also the subject of an embodiment using the compression molding step as described below.

The second step involves application of the mold compound 30 to the bumped bond pads of the semiconductor dice on the active surface area of the semiconductor wafer 10. Mold compound 30 may be any conventional molding or encapsulation compound known in the art, and may include various polymers (including thermosetting compounds such as silicones, epoxies, polyimides, and parylenes), adhesives, B-stage epoxies, and the like. Preferably, molding compound 30 has little or no susceptibility to shrinkage so as to ensure maximum coverage of semiconductor wafer 10 as well as optimum strength in the handling and process steps described below. Cycloaliphatic epoxy resins with anhydride curing agents are preferred mold compound materials in light of their favorable viscosity for flow, good chemical resistance, and low moisture absorption. Typically, mold compound 30 will have a viscosity in the range of from about 10,000 to about 30,000 centipoise, an electrical resistivity greater than about $1.0 \times 10^{12}$ ohm/cm, and a fracture toughness of greater than about 1.3 Mpa-m$^{1/12}$. The viscosity of the molding compound is an important characteristic since, preferably, molding compound will be completely interspersed between conductive bumps 18, as well as evenly dispersed over the bond pads of the semiconductor dice, on the entire active surface area of the semiconductor wafer. Preferably, molding compound 30 should be thermally matched (i.e., have a similar coefficient of thermal expansion) with the materials of the wafer substrate and/or the integrated circuit chip to reduce stresses in subsequent operations. When using epoxies, the coefficient of thermal expansion can be tailored by the addition of ceramic fillers, such as $SiO_2$ as one example.

Figure 4:
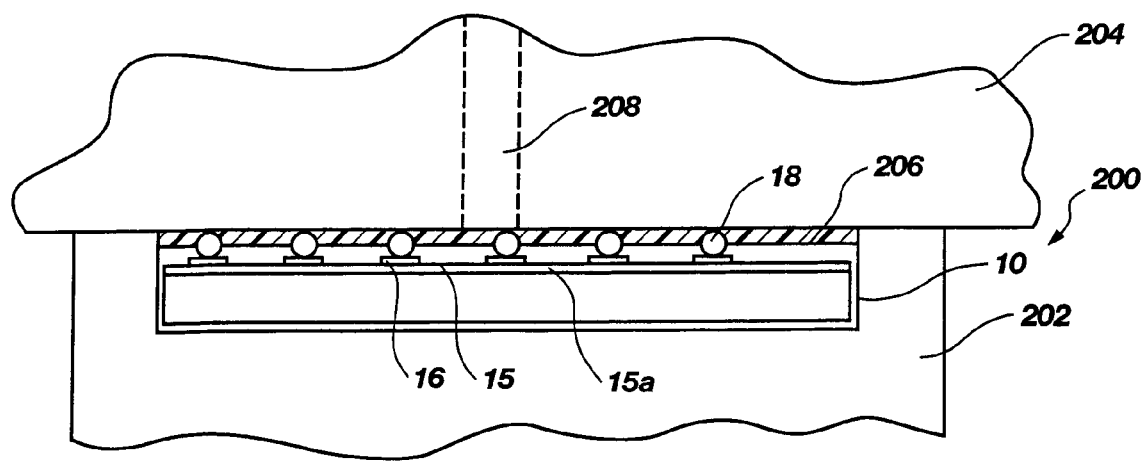
FIG. 4 is a cross-sectional view of a typical semiconductor wafer in a compression mold.

Referring to drawing FIG. 4, in a preferred embodiment, semiconductor wafer 10 is placed in the lower half mold cavity 202 of a wafer-conforming compression mold 200. A mold compound 30 in liquid form is provided through port 208 in the upper half mold cavity 204 of the compression mold 200, or alternatively, preformed mold compound 30 in pellet form is applied onto the active surface 15 of the wafer structure accommodating conductive bumps 18. The upper half of the mold is provided with a thin polymer film or release liner 206, preferably comprised of plastic, specifically designed for conductive bump exposure by contacting and covering at least top portions of the bumps. The upper half of the mold, which may be configured with recesses corresponding to the pattern and dimensions of conductive bumps 18, is closed and the mold cavities 202, 204 heated. In closing the upper mold half, conductive bumps 18 are pressed into the thin plastic film 206, with the film 206 configured to determine the amount of conductive bump 18 desired to be exposed. Due to the closure of the compression mold 200, the compressive forces therein, and the heating of the mold compound 30, mold compound 30 is at least substantially evenly dispersed across the active surface area of the semiconductor wafer 10 and among and around conductive bumps 18 on the bond pads 16 of the semiconductor dice. Once the cure of the mold compound 30 is complete, the compression mold 200 is then opened and the wafer 10 removed. The thin plastic film 206 may be removed from the conductive bumps 18 on the bond pads 16 of the semiconductor dice on the active surface area of the semiconductor wafer 10 while the semiconductor wafer 10 remains in the compression mold 200, or anytime thereafter.

In another embodiment, molding compound 30 may be applied by various means known in the art. Such means include, but are not limited to, needle or syringe dispensing of the compound. When dispensing means are used for the application of molding compound 30, a relatively low viscosity value material should be used if heat is not to be applied substantially contemporaneously.

It is further contemplated that mold compound 30 may be applied over the sides or edges of a semiconductor wafer 10, or even over the entirety of the semiconductor wafer surfaces, to provide added support and protection during subsequent thinning processes. One of skill in the art will recognize that a compression mold can be configured for this purpose.

Reference is again made to drawing FIG. 5, which illustrates a side view of a bumped semiconductor wafer in which molding compound 30 has been applied to the active surface area of the semiconductor wafer. As a result of the molding step, conductive bumps 18 have mold compound dispersed between and around each of conductive bumps 18 on the bond pads of the semiconductor dice on the active surface area of the semiconductor wafer, but not over a top portion of each conductive bump 18. Preferably, the entire bumped surface of the semiconductor wafer 10 will have molding compound dispersed between each of conductive bumps 18 as described herein. However, it is contemplated that in some applications less than all of the active surface area of the semiconductor wafer may be covered.

The third step in the process is the singulation or "dicing" of the semiconductor wafer. By "singulation or dicing," it is meant that the semiconductor wafer is cut so as to define individual semiconductor die. Such singulation or dicing cuts can be entirely through the semiconductor wafer, or only part way through. When cut part way through, the edges of individual semiconductor die will be clearly defined. The singulation or dicing process can be performed by conventional methods using a wafer saw. Due to the added strength and energy absorption provided by the presence of cured molding compound on the wafer face, dicing tape or various other types of submounts are not required, but may be optionally provided. Since circuitry, fiducials and other conventional alignment features located on the semiconductor wafer are typically obscured by molding compound, a preferred embodiment of the present method accomplishes alignment of the wafer saw for dicing by means of a vision system employing pattern recognition of the exposed surfaces of conductive bumps 18 on the bond pads of the semiconductor dice on the active surface area of the semiconductor wafer. In this respect, a wafer map of a standard or rerouted bump pattern can be stored in processing apparatus associated with the vision system of the saw.

Dicing typically takes place from the active surface area of the semiconductor wafer. Because of the extra strength added by the molding compound, street widths located around the semiconductor die of the semiconductor wafer approaching about 75 $\mu$m are possible, dependent upon the starting thickness of the semiconductor wafer. The narrow street widths afforded by the present invention advantageously result in the production of five to ten additional semiconductor dice per semiconductor wafer as opposed to conventional practices. Additionally, the protective aspects of the molding compound safeguard against excessive topside chipping, which can damage an integrated circuit's active circuitry of a semiconductor die, potentially resulting in performance degradation or semiconductor die failure. In this regard, the application of mold compound 30 allows for higher surface speeds during the sawing of the semiconductor wafer. For singulation of the semiconductor dice of the semiconductor wafer, the methods of the present invention preferably incorporate semiconductor dice before grind (DBG) techniques to eliminate the handling of very thin ground semiconductor wafers. In this process, bumped semiconductor wafer 10 is scored through mold compound 30 and part way through the silicon under the active circuitry. For most wafer thicknesses, this step generally entails sawing the semiconductor wafer to a depth equal to the desired bumped integrated circuit chip semiconductor die thickness. For example, if the desired bumped chip thickness (after wafer thinning) is 60 $\mu$m, the bumped semiconductor wafer should be scored to a depth of 60 $\mu$m, after which the semiconductor material has been sufficiently subdivided for the semiconductor dice to be essentially singulated. Again, the application of mold compound 30 renders the dicing tape used in conventional DBG processes unnecessary. Additionally, DBG techniques are particularly effective, in the context of the present method, when used with mold compounds that have relatively high shrinkage rates which could otherwise cause severe stresses on the crystalline structure of the wafer.

After singulation of individual semiconductor die, molding compound 30 also serves as part or all of an underfill material to absorb the inherent physical and thermal stress resulting from differing expansion rates of an integrated circuit semiconductor die and its interconnecting substrate under thermal loading. Additionally, the stability provided by molding compound 30 serves to reduce solder joint failure between the bumps 18 and bond pads 16 of the semiconductor die by spreading any applied stresses over the entire surface of the bump, rather than allowing the stresses to be concentrated at the relatively weak solder joints.

Upon completion of the singulation process, the next step in the present method is to remove silicon from the backside of the semiconductor wafer, or from a semiconductor die, dependent upon the end product of singulation. In preparation thereof, the active surface area of the semiconductor wafer or active surface of the semiconductor die is preferably taped in order to absorb the conductive bumps 18 from pushing through from the various forces applied during the semiconductor wafer thinning processes that follow. The application of a face tape or other submount also provides some additional protection and support for the active surface area of the semiconductor wafer or active surface of the semiconductor dice face during grinding beyond that already provided by mold compound 30. A UV-sensitive tape, which loses its adhesive properties upon cure by UV radiation, is preferable for this purpose.

The backside of the semiconductor wafer or semiconductor dice is then subjected to conventional thinning processes to provide the desired end thicknesses for the semiconductor dice. Preferably, this step comprises backgrinding, which may include multiple grinding steps using a first or coarse grind followed by fine grinding. During the semiconductor wafer grinding process, in order to remove scraps and to cool the semiconductor wafer, a cleaning solution and/or water may also be used. In the situation where DBG techniques are used on a semiconductor wafer, grinding continues until the scores are reached, at which point the integrated circuit semiconductor dice automatically separate. The integrated circuit semiconductor dice that result may be of very thin profiles (0.006") and further have well-defined edges. The present method can further be extended by the inclusion of chemical mechanical planarization process (CMP), which can help reduce post-grinding residual damage to the silicon crystal lattice structure of the thinned integrated circuit semiconductor die.

A standard ball attach process of flux, ball placement, and reflow is used for attaching the conductive bumps 18 to a mounting substrate 50 (see FIG. 6), such as for conventional flip-chip semiconductor die applications. Alternatively, conductive bumps 18 can be adhesively attached to substrate 50 by electrically conductive adhesives known in the art, such as silver-filled epoxies, for example. In an alternate embodiment of the present invention, the flux or adhesive can be a residue or layer attached to a face tape used during wafer thinning. Upon removal of the tape, the residue or layer of flux is left on the conductive bumps. The flux or adhesive can also be applied by conventional means known in the art, including application of a liquid flux or adhesive on a mounting surface during die attach, or by placing the integrated circuit chip on top of either flux or an electrically conductive adhesive paste immediately prior to mounting the semiconductor die.

Following the application of flux or adhesive, the next step in the present method is attachment of the integrated circuit semiconductor die to a mounting (interconnection) substrate 50. For automated placement and bonding, pick and place machines can be used to mount a bare semiconductor die taken from a waffle pack or directly from the singulated semiconductor wafer.

Figure 6:
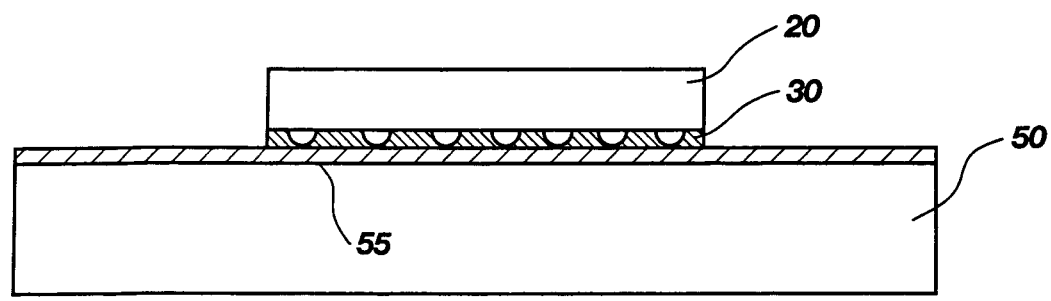
FIG. 6 illustrates a flip-chip semiconductor die mounted and electrically interconnected to a substrate wherein a mold compound acts as all or part of an underfill material between the flip-chip semiconductor die and substrate.

As shown by drawing FIG. 6, an electrical assembly or package is produced by placing and securing the integrated circuit semiconductor die 20 on the upper surface 55 die attach area of substrate 50. Specifically, the conductive bumps 18 of bond pads 16 of integrated circuit semiconductor die 20 are aligned with the circuits and/or contact pads located on upper surface 55 of substrate 50. The integrated circuit semiconductor die 20 is then electrically and mechanically connected to the substrate 50 by reflowing or curing the conductive bumps 18 to the circuits and/or contact pads of the upper surface of substrate 50, depending upon type of material comprising the conductive bumps 18.

In conventional flip-chip semiconductor die practices, after conductive bumps 18 on bond pads 16 of the integrated circuit semiconductor die 20 are reflowed to electrically and mechanically connect the integrated circuit semiconductor die 20 to the circuits and/or contact pads of substrate 50, a space or gap is formed between the active surface 15 of integrated circuit semiconductor die 20 and the upper surface 55 of substrate 50, the size of the gap generally being determined by the size of the reflowed conductive bumps on the bond pads of the integrated circuit semiconductor die 20. Typically, such a gap will vary from approximately 3 mils to about 10 mils.

With further reference to drawing FIG. 6, molding compound 30 may serve as part or all of an underfill material that, in conventional flip-chip semiconductor die practices, is usually injected into the above-described gap between the mounted integrated circuit semiconductor die and its interconnecting substrate. In conventional flip-chip semiconductor die packages and in the present invention, underfill material 30 serves to improve the physical connection between integrated circuit semiconductor die 20 and its mounting substrate 50, and to absorb the inherent physical and thermal stress resulting from their differing expansion rates under thermal loading. More specifically, molding compound/underfill material 30 advantageously serves to: distribute loads placed on the integrated circuit semiconductor die 20 and substrate 50, transfer heat away from the integrated circuit semiconductor die; provide a reduced corrosion environment between substrate 50 and integrated circuit semiconductor die 20; and provide an additional mechanical bond between the integrated circuit semiconductor die and the substrate to help distribute loading and stress on the integrated circuit semiconductor die and conductive bumps 18.

With regard to the underfill material found between an integrated circuit semiconductor die and a substrate, the method of the present invention offers clear advantages over the prior art. In current methods, filling the gap between an integrated circuit chip and a substrate with underfill material poses several problems from a manufacturing perspective, foremost of which are: (1) uniformly filling the gap without the occurrence of voids; and (2) the time required for filling the gap between the integrated circuit semiconductor die and the substrate with the underfill material. The occurrence of voids are especially problematic, since a degree of the mechanical, performance, and reliability improvements afforded by the underfill would be lost if one or more voids were present. By using the present method step of applying the underfill/mold compound 30 material to the integrated circuit semiconductor die prior to mounting the semiconductor die, underfill/mold compound 30 can be quickly and uniformly dispersed around and among conductive bumps 18. Thus, in addition to providing support and active surface protection for a semiconductor wafer during the thinning process, the application of mold compound by the method of the present invention allows for relatively high throughput in underfill applications, while avoiding the occurrence of voids.

Other advantages provided by the method of use of the mold compound of the present invention and not realized by prior art underfill processes, include: providing passivation to prevent conductive bumps 18 from shorting during reflow; providing a surface area which allows for the thinned integrated circuit chip to remain parallel to its interconnection substrate during reflow, thus providing a uniform bondline; and protecting the solder joints on the bumped semiconductor wafer or semiconductor die during thinning, handling, and die attach processes.

Following electrical and mechanical connection of the integrated circuit semiconductor die to the substrate, the assembly or portions thereof may then be encapsulated, or not, depending upon the particular application for which the assembly is to be employed.

Hereinbefore, various embodiments of methods for the thinning of a semiconductor wafer and fabrication of a flip-chip semiconductor die and flip-chip semiconductor die assembly have been described in relation to the appended drawings. However, the various embodiments are merely exemplary of the present invention and, thus, the specific features described herein are merely used to more easily describe such embodiments and to provide an overall understanding of the present invention. Accordingly, one skilled in the art will readily recognize that the present invention is not limited to the specific embodiments described herein.

As such, while the present invention has been described in terms of certain methods and embodiments, it is not so limited, and those of ordinary skill in the art will readily recognize and appreciate that many additions, deletions and modifications to the embodiments described herein may be made without departing from the scope of the invention as hereinafter claimed. For instance, upon die attach, additional underfill material may be added to the mold compound already under an integrated circuit semiconductor die to fill any additional gaps located between any type substrate and any type integrated circuit die. Such underfill material could be added, for example, by dispensing or injecting the material into a semiconductor/substrate interconnection gap at one or more sides of the chip. It is also contemplated that the methods of the present invention could be applied to, or used in adjunct fashion with, a myriad of semiconductor wafer thinning processes known in the art. Such processes include, but are not limited to, plasma etch, wet chemical etch, microblasting, lapping, sputter removal, or a combination thereof. In addition, the present methods are not limited to semiconductor wafers made of silicon or gallium arsenide, but may also encompass any other type of semiconductor wafer that requires mechanical support and/or active circuitry protection during backside processing of the semiconductor wafer. Therefore, it is intended that this invention encompass all such variations and modifications as fall within the scope of the appended claims.

What is claimed is:

1. A method for thinning a semiconductor wafer, comprising:

providing a semiconductor wafer having an active surface and an inactive surface, said active surface including a plurality of circuitry elements forming a plurality of semiconductor dice, at least one semiconductor die of said plurality of semiconductor dice having a plurality of spaced apart bond pads located on the active surface thereof;

forming electrically conductive bumps on at least some of said plurality of spaced apart bond pads on said active surface of the at least one semiconductor die of the plurality of semiconductor dice on said active surface of said semiconductor wafer;

applying a structurally supportive compound to at least a portion of said active surface of said semiconductor wafer, said structurally supportive compound being disposed between at least some of said electrically conductive bumps; and subjecting said inactive surface of said semiconductor wafer to a thinning process.

2. The method of claim 1, further comprising:

dicing said semiconductor wafer to a depth after said applying said structurally supportive compound.

3. The method of claim 2, wherein said dicing said semiconductor wafer to said depth comprises:

cutting through said structurally supportive compound; and cutting through at least a portion of said semiconductor wafer to define a plurality of distinct integrated circuit semiconductor dice.

4. The method of claim 3, wherein said subjecting said inactive surface of said semiconductor wafer to said thinning process comprises:

thinning said semiconductor wafer to a depth reaching said depth of said dicing.

5. The method of claim 4, wherein said dicing said semiconductor wafer to said depth comprises:

dicing said semiconductor wafer to a depth representing a desired thickness of an integrated circuit semiconductor die of said plurality of distinct integrated circuit semiconductor dice.

6. The method of claim 2, wherein said forming said electrically conductive bumps on said at least some of said plurality of spaced apart bond pads comprises:

forming said electrically conductive bumps on said at least some of said plurality of spaced apart bond pads in a standard reproducible pattern; and said dicing said semiconductor wafer to said depth comprises:

aligning said semiconductor wafer for said dicing by recognizing said standard reproducible pattern of said electrically conductive bumps.

7. The method of claim 1, wherein said forming said electrically conductive bumps comprises:

forming said electrically conductive bumps of a solder alloy.

8. The method of claim 1, wherein said forming said electrically conductive bumps comprises:

forming said electrically conductive bumps of a semispherical configuration.

9. The method of claim 1, wherein said forming said electrically conductive bumps comprises:

forming said electrically conductive bumps of a substantially columnar configuration.

10. The method of claim 1, wherein said forming said electrically conductive bumps comprises:

forming said electrically conductive bumps of substantially uniform dimensions.

11. The method of claim 1, wherein said applying said structurally supportive compound comprises:

applying said structurally supportive compound of one of silicones, polyimides, epoxies, urethanes and parylenes.

12. The method of claim 1, wherein said applying said structurally supportive compound comprises:

applying a B-stage epoxy.

13. The method of claim 1, wherein said applying said structurally supportive compound comprises:

applying a cycloaliphatic epoxy resin.

14. The method of claim 1, further comprising:

placing said semiconductor wafer in a mold apparatus; and said applying said structurally supportive compound comprises:

dispersing said structurally supportive compound by compressive forces and heat applied by said mold apparatus.

15. The method of claim 14, wherein said mold apparatus comprises:

an upper mold portion and a lower mold portion, said upper mold portion covering at least a portion of at least some of said electrically conductive bumps of said semiconductor wafer upon urging said upper mold portion and said lower mold portion together for preventing said structurally supportive compound from contacting at least a portion of a top surface area of said at least some of said electrically conductive bumps.

16. The method of claim 15, wherein said upper mold portion comprises a release liner configured for said preventing said structurally supportive compound from said contacting said at least a portion of said at least some of said electrically conductive bumps.

17. The method of claim 1, wherein said applying said structurally supportive compound comprises:

applying said structurally supportive compound in one of a liquid form or a pellet form.

18. The method of claim 1, wherein said applying said structurally supportive compound comprises:

applying said structurally supportive compound by dispensing said structurally supportive compound with a needle or a syringe apparatus.

19. The method of claim 1, further comprising:

curing said structurally supportive compound after said applying said structurally supportive compound.

20. The method of claim 1, wherein said applying said structurally supportive compound comprises:

applying said structurally supportive compound over a substantial portion of said active surface of said semiconductor wafer.

21. The method of claim 1, further comprising:

applying a protective film over said at least a portion of said electrically conductive bumps on said active surface of said semiconductor wafer prior to said subjecting said inactive surface of said semiconductor wafer to said thinning process.

22. The method of claim 21, wherein said protective film comprises:

a layer of flux material suitable for a process of reflowing; and interconnecting said electrically conductive bumps to metallized pads of a substrate.

23. The method of claim 21, wherein said protective film comprises:

a layer of adhesive material suitable for adhering said electrically conductive bumps to said metallized pads of a substrate.

24. The method of claim 1, wherein said subjecting said inactive surface of said semiconductor wafer to said thinning process comprises:

subjecting said inactive surface of said semiconductor wafer to a backgrinding process.

25. The method of claim 24, wherein said subjecting said inactive surface of said semiconductor wafer to said thinning process comprises:
    subjecting said inactive surface of said semiconductor wafer to a chemical mechanical planarization process after said backgrinding process.

26. The method of claim 1, wherein said subjecting said inactive surface of said semiconductor wafer to said thinning process comprises:
    subjecting said inactive surface of said semiconductor wafer to said thinning process selected from one of said backgrinding, plasma etch, wet chemical etch, microblasting, lapping, sputter removal, and a combination of any thereof.

27. The method of claim 1, wherein said applying said structurally supportive compound comprises;
    applying said structurally supportive compound having a coefficient of expansion approximating that of said semiconductor wafer.

28. A method of fabricating flip-chip type semiconductor dice comprising:
    providing a semiconductor wafer having an active surface and an inactive surface, said active surface including a plurality of circuitry elements forming a plurality of semiconductor dice located thereon, at least one semiconductor die of said plurality of semiconductor dice having a plurality of spaced apart bond pads located on the active surface thereof;
    forming electrically conductive bumps on at least some of said plurality of spaced apart bond pads of said at least one semiconductor die of said plurality of semiconductor dice of said semiconductor wafer;
    applying a structurally supportive compound to at least a portion of said active surface of said semiconductor wafer;
    dicing said semiconductor wafer to a depth to define said semiconductor wafer into a plurality of integrated circuit semiconductor dice, each semiconductor die of said plurality of integrated circuit semiconductor dice having an active surface and an inactive surface, said active surface of at least one semiconductor die of said plurality of integrated circuit semiconductor dice having at least some electrically conductive bumps having said structurally supportive compound dispersed therebetween; and
    subjecting the inactive surface of said at least one semiconductor die of said plurality of integrated circuit semiconductor dice to a thinning process to obtain a plurality of thinned flip-chip semiconductor dice.

29. The method of claim 28, wherein said dicing said semiconductor wafer to said depth comprises:
    cutting through said structurally supportive compound thereon; and
    cutting through at least a portion of said semiconductor wafer to define said semiconductor wafer into said plurality of integrated circuit semiconductor dice.

30. The method of claim 29, wherein said subjecting said inactive surface of said at least one semiconductor die of said plurality of integrated circuit semiconductor dice to said thinning process comprises:
    thinning said at least one semiconductor die of said plurality of integrated circuit semiconductor dice to a depth reaching said depth of said dicing.

31. The method of claim 30, wherein said dicing said semiconductor wafer to said depth comprises:
    dicing said semiconductor wafer to a depth representing a desired thickness of said plurality of integrated circuit semiconductor dice.

32. The method of claim 28, wherein said forming said electrically conductive bumps on said at least some of said plurality of spaced apart bond pads comprises:
    forming said electrically conductive bumps on said at least some of said plurality of spaced apart bond pads of said at least one semiconductor die of said plurality of semiconductor dice in a standard reproducible pattern; and
    wherein said dicing said semiconductor wafer to said depth comprises:
        aligning said semiconductor wafer for said dicing by recognizing said standard reproducible pattern of said electrically conductive bumps.

33. The method of claim 28, wherein said forming said electrically conductive bumps comprises:
    forming said electrically conductive bumps of a solder alloy.

34. The method of claim 28, wherein said forming said electrically conductive bumps comprises:
    forming said electrically conductive bumps of a semispherical configuration.

35. The method of claim 28, wherein said forming said electrically conductive bumps comprises:
    forming said electrically conductive bumps of a substantially columnar configuration.

36. The method of claim 28, wherein said forming said electrically conductive bumps comprises:
    forming said electrically conductive bumps of substantially uniform dimensions.

37. The method of claim 28, wherein said applying said structurally supportive compound comprises:
    applying said structurally supportive compound selected from one of silicones, polyimides, epoxies, urethanes and parylenes.

38. The method of claim 28, wherein said applying said structurally supportive compound comprises:
    applying a B-stage epoxy.

39. The method of claim 28, wherein said applying said structurally supportive compound comprises:
    applying a cycloaliphatic epoxy resin.

40. The method of claim 28, further comprising:
    placing said semiconductor wafer in a mold apparatus; and
    wherein said applying said structurally supportive compound comprises:
        dispersing said structurally supportive compound by compressive forces and heat applied by said mold apparatus.

41. The method of claim 40, wherein said mold apparatus comprises:
    an upper mold portion and a lower mold portion, said upper mold portion covering at least a portion of said at least some of said electrically conductive bumps of said at least one semiconductor die of said plurality of semiconductor dice of said semiconductor wafer upon urging said upper mold portion and said lower mold portion together to prevent said structurally supportive compound from contacting said at least a portion of said at least some of said electrically conductive bumps.

42. The method of claim 41, wherein said upper mold portion comprises:
a release liner to prevent said structurally supportive compound from said contacting said at least a portion of said at least some of said electrically conductive bumps.

43. The method of claim 28, wherein said applying said structurally supportive compound comprises:
applying said structurally supportive compound in one of a liquid form or a pellet form.

44. The method of claim 28, wherein said applying said structurally supportive compound comprises:
applying said structurally supportive compound by dispensing said structurally supportive compound with a needle or a syringe apparatus.

45. The method of claim 28, further comprising:
curing said structurally supportive compound after said applying said structurally supportive compound.

46. The method of claim 28, wherein said applying said structurally supportive compound comprises:
applying said structurally supportive compound over a substantial portion of said active surface of said semiconductor wafer.

47. The method of claim 28, further comprising:
applying a protective film over said at least a portion of said electrically conductive bumps on said each semiconductor die of said plurality of integrated circuit semiconductor dice prior to said subjecting said inactive surface of said at least one semiconductor die of said plurality of integrated circuit semiconductor dice to said thinning process.

48. The method of claim 47, wherein said protective film comprises:
a layer of flux material for reflowing and interconnecting said electrically conductive bumps of said at least one semiconductor die of said plurality of integrated circuit semiconductor dice to metallized pads of a substrate.

49. The method of claim 47, wherein said protective film comprises:
a layer of adhesive material suitable for adhering said electrically conductive bumps of said at least one semiconductor die of said plurality of integrated circuit semiconductor dice to said metallized pads of a substrate.

50. The method of claim 28, wherein said subjecting said inactive surface of said at least one semiconductor die of said plurality of integrated circuit semiconductor dice to said thinning process comprises:
subjecting said inactive surface of said at least one semiconductor die of said plurality of integrated circuit semiconductor dice to a backgrinding process.

51. The method of claim 50, wherein said subjecting said inactive surface of said at least one semiconductor die of said plurality of integrated circuit semiconductor dice to said thinning process includes:
subjecting said inactive surface of said at least one semiconductor die of said plurality of integrated circuit semiconductor dice to a chemical mechanical planarization process after said backgrinding process.

52. The method of claim 28, wherein said subjecting said inactive surface of said at least one semiconductor die of said plurality of integrated circuit semiconductor dice to said thinning process comprises:
subjecting said inactive surface of said at least one semiconductor die of said plurality of integrated circuit semiconductor dice to said thinning process selected from one of said backgrinding, plasma etch, wet chemical etch, micro-blasting, lapping, sputter removal, and a combination of any thereof.

53. The method of claim 28, wherein said applying said structurally supportive compound comprises:
applying said structurally supportive compound having a coefficient of expansion approximating that of said plurality of thinned flip-chip semiconductor dice.

54. A method of fabricating a flip-chip semiconductor die assembly comprising:
providing a semiconductor wafer having an active surface and an inactive surface, said active surface including a plurality of circuitry elements forming a plurality of semiconductor dice thereon, at least one semiconductor die of said plurality of semiconductor dice having a plurality of spaced apart bond pads located on the active surface thereof;
forming electrically conductive bumps on at least some of said plurality of spaced apart bond pads on said active surface of said at least one semiconductor die of said plurality of semiconductor dice;
applying a structurally supportive compound to at least a portion of said active surface of said semiconductor wafer;
dicing said semiconductor wafer to a depth to define said semiconductor wafer into a plurality of integrated circuit semiconductor dice, each of said plurality of integrated circuit semiconductor dice having an active surface and an inactive surface, said active surface of at least one semiconductor die of said plurality of integrated circuit semiconductor dice having at least some electrically conductive bumps with having at least some of said structurally supportive compound dispersed therebetween;
subjecting the inactive surface of said at least one semiconductor die of said plurality of integrated circuit semiconductor dice to a thinning process forming at least one thinned integrated circuit semiconductor die;
providing an electrically conductive substrate; and
mounting said at least one thinned integrated circuit semiconductor die to said electrically conductive substrate.

55. The method of claim 54, wherein said dicing said semiconductor wafer to said depth comprises:
cutting through said structurally supportive compound thereon; and
cutting through at least a portion of said semiconductor wafer defining said semiconductor wafer into said plurality of integrated circuit semiconductor dice.

56. The method of claim 54, wherein said subjecting said inactive surface of said at least one semiconductor die of said plurality of integrated circuit semiconductor dice to said thinning process comprises:
thinning said at least one semiconductor die of said plurality of integrated circuit semiconductor dice to a depth reaching said depth of said dicing.

57. The method of claim 54, wherein said dicing said semiconductor wafer to said depth comprises:
dicing said semiconductor wafer to a depth representing a desired thickness of said plurality of integrated circuit semiconductor dice.

58. The method of claim 54, wherein said forming said electrically conductive bumps on at least some of said plurality of spaced apart bond pads of said at least one semiconductor die comprises:

forming said electrically conductive bumps on said at least some of said plurality of spaced apart bond pads of said at least one semiconductor die of said plurality of semiconductor dice in a standard reproducible pattern; and wherein said dicing said semiconductor wafer to said depth comprises:
aligning said semiconductor wafer for said dicing by recognizing said standard reproducible pattern of said electrically conductive bumps.

59. The method of claim 54, wherein said forming said electrically conductive bumps comprises:
forming said electrically conductive bumps of a solder alloy.

60. The method of claim 54, wherein said forming said electrically conductive bumps comprises:
forming said electrically conductive bumps of a semi-spherical configuration.

61. The method of claim 54, wherein said forming said electrically conductive bumps comprises:
forming said electrically conductive bumps of a substantially columnar configuration.

62. The method of claim 54, wherein said forming said electrically conductive bumps comprises:
forming said electrically conductive bumps of substantially uniform dimensions.

63. The method of claim 54, wherein said applying said structurally supportive compound comprises:
applying said structurally supportive compound of one of silicones, polyimides, epoxies, urethanes and parylenes.

64. The method of claim 54, wherein said applying said structurally supportive compound comprises:
applying a B-stage epoxy.

65. The method of claim 54, wherein said applying said structurally supportive compound comprises:
applying a cycloaliphatic epoxy resin.

66. The method of claim 54, further comprising:
placing said semiconductor wafer in a mold apparatus; and wherein said applying said structurally supportive compound comprises:
dispersing said structurally supportive compound by compressive forces and heat applied by said mold apparatus.

67. The method of claim 66, wherein said mold apparatus comprises:
an upper mold portion and a lower mold portion, said upper mold portion covering at least a portion of said at least some of said electrically conductive bumps of said at least one semiconductor die of said plurality of semiconductor dice upon urging said upper mold portion and said lower mold portion together for preventing said structurally supportive compound from contacting said at least a portion of said at least some of said electrically conductive bumps.

68. The method of claim 67, wherein said upper mold portion comprises:
a release liner preventing said structurally supportive compound from said contacting said at least a portion of said at least some of said electrically conductive bumps.

69. The method of claim 54, wherein said applying said structurally supportive compound comprises:
applying said structurally supportive compound in one of a liquid or a pellet form.

70. The method of claim 54, wherein said applying said structurally supportive compound comprises:
applying said structurally supportive compound by dispensing said structurally supportive compound with a needle or a syringe apparatus.

71. The method of claim 54, further comprising:
curing said structurally supportive compound after said applying said structurally supportive compound.

72. The method of claim 54, wherein said applying said structurally supportive compound comprises:
applying said structurally supportive compound on a substantial portion of said active surface of said at least one semiconductor die of said plurality of semiconductor dice.

73. The method of claim 54, further comprising:
applying a protective film over said at least a portion of said electrically conductive bumps on said at least one semiconductor die of said plurality of integrated circuit semiconductor dice; and
subjecting said inactive surface of at least some of said plurality of integrated circuit semiconductor dice to said thinning process after said applying said structurally supportive compound.

74. The method of claim 73, wherein said protective film comprises:
a layer of flux material suitable for a process of reflowing and interconnecting said electrically conductive bumps on said at least one semiconductor die of said plurality of integrated circuit semiconductor dice to metallized pads of a substrate.

75. The method of claim 73, wherein said protective film comprises:
a layer of adhesive material suitable for adhering said electrically conductive bumps on said at least one semiconductor die of said plurality of integrated circuit semiconductor dice to said metallized pads of a substrate.

76. The method of claim 54, wherein said subjecting said inactive surface of said at least one semiconductor die of said plurality of integrated circuit semiconductor dice to said thinning process comprises:
subjecting said inactive surface of at least some of said plurality of integrated circuit semiconductor dice to a backgrinding process.

77. The method of claim 76, wherein said subjecting said inactive surface of said at least one semiconductor die of said plurality of integrated circuit semiconductor dice to said thinning process comprises:
subjecting said inactive surface of said at least one semiconductor die of said plurality of integrated circuit semiconductor dice to a chemical mechanical planarization process after said backgrinding process.

78. The method of claim 54, wherein said subjecting said inactive surface of said at least one semiconductor die of said plurality of integrated circuit semiconductor dice to said thinning process comprises:
subjecting said inactive surface of at least some of said plurality of integrated circuit semiconductor dice to said thinning process selected from one of said backgrinding, plasma etch, wet chemical etch, microblasting, lapping, sputter removal, and a combination of any thereof.

79. The method of claim 54, wherein said electrically conductive substrate comprises a printed circuit board.

80. The method of claim 54, wherein said providing said electrically conductive substrate comprises:

providing said electrically conductive substrate having a plurality of metallized pads thereon; and wherein said mounting said at least one thinned integrated circuit semiconductor die to said electrically conductive substrate comprises:

electrically interconnecting said at least some of said electrically conductive bumps of said at least one thinned integrated circuit semiconductor die to at least some of said plurality of metallized pads on said electrically conductive substrate.

81. The method of claim 80, wherein said electrically interconnecting said at least some of said electrically conductive bumps of said at least one thinned integrated circuit semiconductor die to said at least some of said plurality of metallized pads on said electrically conductive substrate comprises:

fluxing and then reflowing said at least some of said electrically conductive bumps of said at least one thinned integrated circuit semiconductor die.

82. The method of claim 80, wherein said electrically interconnecting said at least some of said electrically conductive bumps of said at least one thinned integrated circuit semiconductor die to said at least some of said plurality of metallized pads on said electrically conductive substrate comprises:

applying an electrically conductive adhesive to said at least some of said electrically conductive bumps and said at least some of said plurality of metallized pads on said electrically conductive substrate.

83. The method of claim 54, wherein said applying said structurally supportive compound comprises:

applying said structurally supportive compound having a coefficient of expansion approximating that of said plurality of integrated circuit semiconductor dice.

84. The method of claim 54, wherein said applying said structurally supportive compound comprises:

applying said structurally supportive compound having a coefficient of expansion approximating that of said electrically conductive substrate.

* * * * *

UNITED STATES PATENT AND TRADEMARK OFFICE
CERTIFICATE OF CORRECTION

PATENT NO.    : 6,506,681 B2
DATED         : January 14, 2003
INVENTOR(S)   : Ford B. Grigg and Timothy L. Jackson It is certified that error appears in the above-identified patent and that said Letters Patent is hereby corrected as shown below:

Column 3,
Line 11, insert a period after "off"

Column 12,
Line 16, delete the period after "port"

Signed and Sealed this

Tenth Day of June, 2003

JAMES E. ROGAN
*Director of the United States Patent and Trademark Office*